United States Patent [19]

Yang

[11] Patent Number: 5,422,286

[45] Date of Patent: Jun. 6, 1995

[54] PROCESS FOR FABRICATING HIGH-VOLTAGE SEMICONDUCTOR POWER DEVICE

[75] Inventor: Sheng-Hsing Yang, Hsinchu, Taiwan, Prov. of China

[73] Assignee: United Microelectronics Corp., Hsinchu, Taiwan, Prov. of China

[21] Appl. No.: 319,802

[22] Filed: Oct. 7, 1994

[51] Int. Cl.⁶ .................................... H01L 21/328
[52] U.S. Cl. .................................... 437/6; 437/65; 437/66; 437/203
[58] Field of Search ................ 437/6, 65, 66, 203; 156/650, 651, 654

[56] References Cited

U.S. PATENT DOCUMENTS

| | | | |
|---|---|---|---|
| 4,904,609 | 2/1990 | Temple | 437/6 |
| 4,914,043 | 4/1990 | Nishizawa et al. | 437/203 |
| 5,213,994 | 5/1993 | Fuchs. | |
| 5,346,849 | 9/1994 | Tokunoh | 437/66 |

FOREIGN PATENT DOCUMENTS

| | | | |
|---|---|---|---|
| 31898 | 7/1981 | European Pat. Off. | 437/6 |
| 2132412 | 7/1984 | United Kingdom | 437/6 |

*Primary Examiner*—Brian E. Hearn
*Assistant Examiner*—Kevin M. Picardat
*Attorney, Agent, or Firm*—Ladas & Parry

[57] ABSTRACT

A process for fabricating a high-voltage semiconductor power device on a substrate of a first conductivity type is described. A lightly-doped epitaxial layer of the first conductivity type having a first thickness and a doped layer of a second conductivity type having a second thickness are then formed on the substrate. First grooves are formed by etching through the doped layer into the lightly-doped epitaxial layer. A pad oxide layer is formed on the exposed surfaces of the lightly-doped epitaxial layer and the doped layer. Silicon nitride spacers are formed on sidewalls of the first grooves. The thickness of portions of the pad oxide layer not covered by the silicon nitride spacers is increased by thermal oxidation. The silicon nitride spacers and portions of the pad oxide layer underlying the silicon nitride spacers are then removed. Second grooves are formed by etching through the bottoms of the first grooves and into the lightly-doped epitaxial layer using the remaining portions of the pad oxide as a mask. The remaining pad oxide is removed. Finally, a passivation layer and metal layers are formed completing the high-voltage semiconductor power device.

15 Claims, 5 Drawing Sheets

PROCESS FOR FABRICATING HIGH-VOLTAGE SEMICONDUCTOR POWER DEVICE

BACKGROUND OF THE INVENTION

1. Field of the Invention

The present invention relates in general to a process for fabricating high voltage semiconductor devices. In particular, the present invention relates to a process for fabricating semiconductor devices capable of handling high voltages and large currents.

2. Technical Background

Semiconductor devices, such as, rectifiers and thyristors, are capable of withstanding up to 1,000 volts at their terminals when reverse biased, i.e., they are turned off (non-conducting). Over 100 amperes of DC current can be passed through these devices when forward biased, i.e. they are turned on (conducting). These power electronic devices are basic components of modern power control equipment. They play the role of electronic switches, corresponding to their mechanical counterparts, while enjoying generally high power handling efficiencies.

In order for these semiconductor electronic devices to handle voltages in the range of $10^3$ volts or higher, the junction voltage distribution profile over the terminal junction must be carefully controlled. Uneven distribution of this junction voltage may easily result in flashover or channeling in the junction area.

Referring now to FIGS. 1 to 5, a prior art process for making such devices will now be described. Semiconductor substrate 10 comprises a N+ region 12, a N− region 14 and a P+ region 16, typically prepared by epitaxially growing region 14 on initial substrate 12 and thereafter creating region 16 by further epitaxial growth or doping. Substrate 10 has thickness 13 of typically about 690 μm (27 mils), N− region 14 has thickness 15 of about 110 μm and P+ doped region 16 has thickness 17 of about 10 μm.

Grooves 22 of depth 24 are formed in substrate 10, for example, by sawing or by etching through openings 20 in mask 18. Such methods are well known in the art. This provides the structure shown in FIG. 2. These grooves cross in both directions—as in a grid like pattern—so that the resulting device is square. The mask 18 is then removed.

A second mask 26 having openings 28 is then applied to the surface of the structure of FIG. 2. A further etching is carried out to deepen grooves 22 to penetrate into the N+ region 12. Openings 28 are generally wider than openings 20 so that stepped sidewalls are formed, resulting in grooves 30 of depth 32, as illustrated in FIG. 3.

Passivation material 36, as for example a glass or organic polymer, is spun on or otherwise applied and patterned as shown in FIG. 4 using means well known in the art to cover the sidewalls of grooves 30. This passivation material protects the PN junction formed between N− region 14 and P+ region 16 that extends to the sidewalls of grooves 30. Metal layers 38 and 39 are also formed using well known means to provide ohmic contact to the semiconductor regions. Substrate 10 is then separated into individual device die 11 by conventional means, as for example sawing or etching, to provide the finished device illustrated in FIG. 5.

In this conventional fabrication process for power semiconductors, shown in FIGS. 1–5, at least four photolithography procedures are required. They are required in each of the process stages depicted in FIGS. 2–4, respectively, namely for delineating grooves 22, grooves 30, passivation material 36 and metal 38. The precision of the results of photolithography procedures is influenced by terrain elevational fluctuations, particularly drastic elevational changes in a small substrate surface, that is, in the wafer surface areas. This is due to the limited depth of focus of the optical equipment used in the photolithography procedures.

Photolithography techniques employed in conventional semiconductor device fabrication procedures, are based on considerations of life expectancy and resolution limitations of the masks, and typically include projection scanning, reduction step-and-repeat projection aligning, and non-reduction step-and-repeat projection aligning techniques. The depth of focus is about ±6 μm for projection, is about ±5 μm for non-reduction step-and-repeat projection aligning, and is much smaller for the reduction step-and-repeat projection aligning. The thickness of the P+ region 16, however, as seen in FIGS. 1–5 is already 10 μm, a scale which really tests the manufacturing tolerances of such techniques. As a result, the photolithography precision will be worse than barely acceptable in regions such as at the bottom of the groove 20, and/or the bottom of groove 30. Poor masking precision results in decreased fabrication yields, which leads directly to higher manufacturing costs for these semiconductor devices. Poor masking precision due to mask misalignment, on the other hand, results in poor symmetry in the formation of stepped sidewall, which in turn causes an uneven voltage distribution profile in the device and causes decreased effectiveness and premature failure of the semiconductor device.

Moreover, long etching times are required to form the deep grooves 22 and 33, hence the cost of manufacture is high. And since the grooves typically cut into the layer 12 of the substrate 10 that significantly reduces the mechanical strength of the substrate 10, breakage of the substrate will easily occur during fabrication. Thus, the conventional process of fabricating high-voltage devices cannot not gain a good fabrication yield.

SUMMARY OF THE INVENTION

It is therefore an object of the present invention to provide a process for fabricating high-voltage semiconductor power devices, with accurate self-alignment of the second groove against the first groove, allowing for accurate symmetry of stepped sidewalls in the grooves.

It is another object of the present invention to provide a process for fabricating high-voltage semiconductor power device, capable of reducing the number of photolithography procedures used, allowing the accurate formation of stepped sidewalls in the grooves thereby resulting in an even distribution of voltage across the junction to promote the device life expectancy and power switching efficiency.

In accordance with the above-identified objects of the present invention, a process for fabricating high-voltage semiconductor power devices on a substrate of a first conductivity type is achieved. A first, lightly-doped, epitaxial layer of first conductivity type and having a first thickness is formed on the substrate followed by a second, doped, layer of second conductivity type and having a second thickness formed on the first layer. First grooves are formed by etching through the second layer and into the first layer. A pad oxide layer is formed on the exposed surfaces of the first and second layers. Silicon nitride protective spacers are formed on sidewalls of the first grooves. The thickness of those portions of the pad oxide layer not covered by the silicon nitride spacers is increased by thermal oxidation. The silicon nitride spacers and portions of the pad oxide layer underlying the silicon nitride spacers are removed. Second grooves are formed by etching through the bottoms of the first grooves and into the lightly-doped epitaxial layer, using remaining portions of the pad oxide layer as masks. The remaining pad oxide layer is removed. Finally, a passivation layer and metal layers are formed, completing the high-voltage semiconductor power device.

BRIEF DESCRIPTION OF THE DRAWINGS

Other objects, features and advantages of the present invention will become apparent by way of the following detailed description of the preferred but non-limiting embodiment. The description is made with reference to the accompanied drawings, wherein.

In all the Figures, like reference numeral represents the same or similar components, or portions, of the semiconductor power device utilized for the description of the present invention.

DETAILED DESCRIPTION OF THE PREFERRED EMBODIMENT

Figure 1:
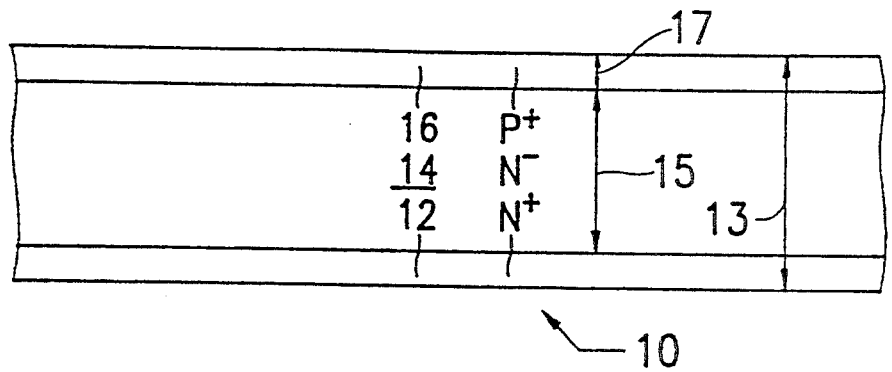
FIGS. 1-5 show in a schematic form cross-sectional views of a high-voltage semiconductor power device in selected process stages of fabrication according to the prior art.
Figure 2:
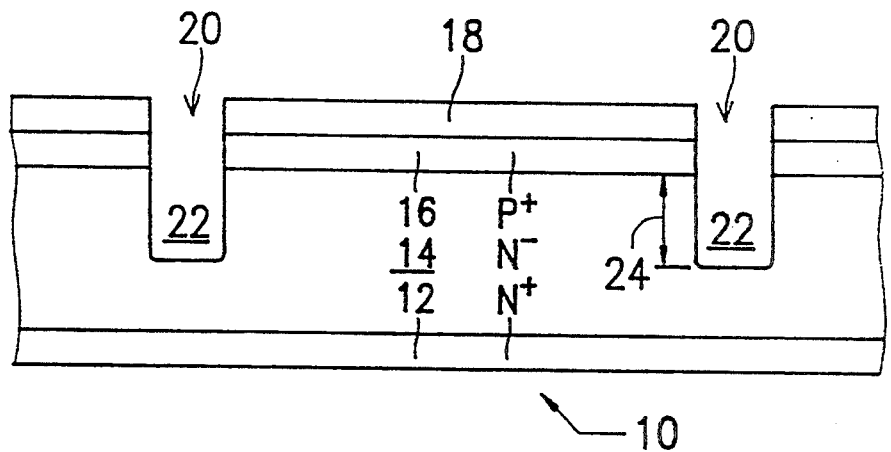
Figure 3:
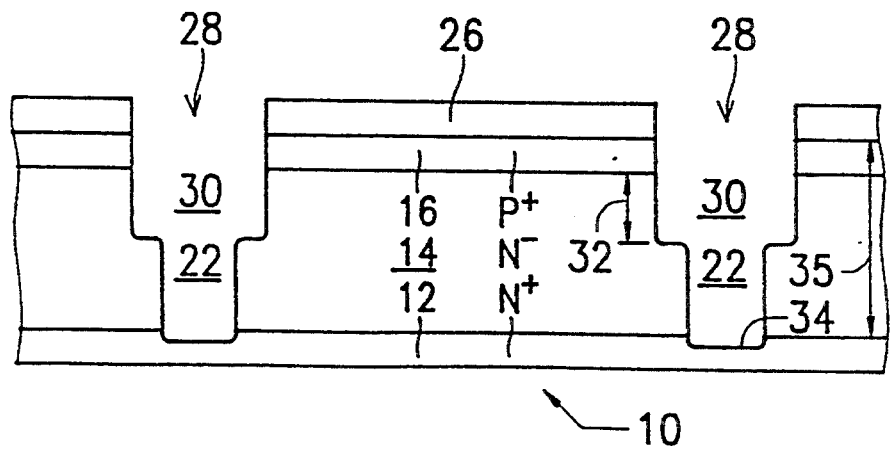
Figure 4:
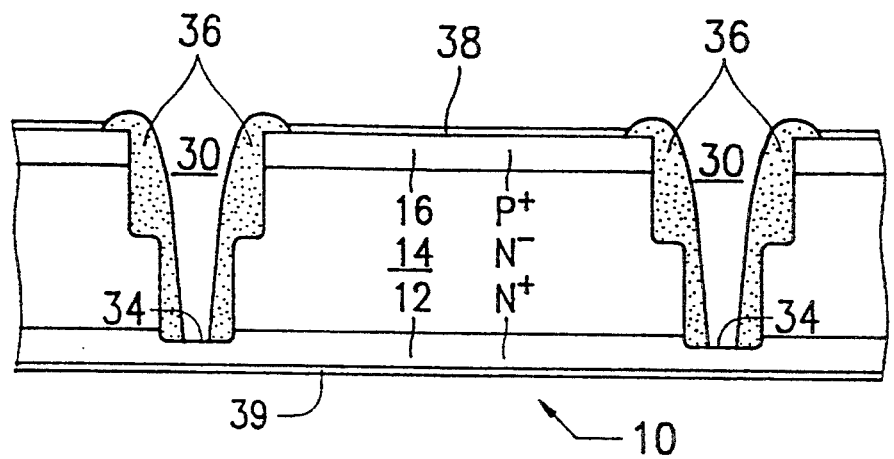
Figure 5:
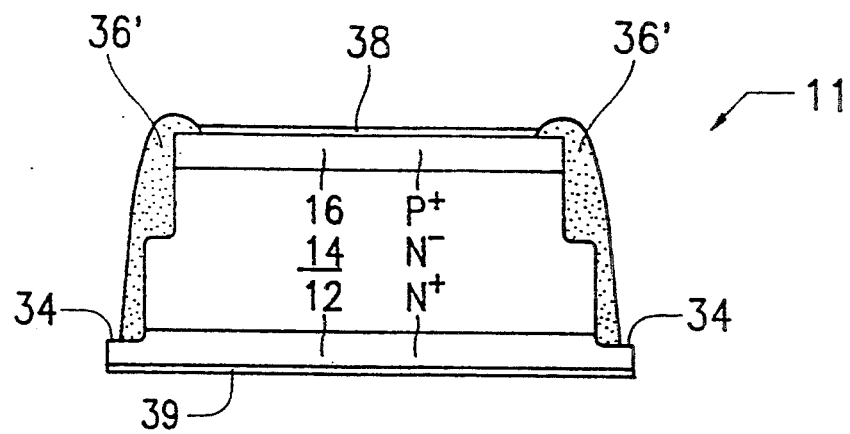
Figure 6:
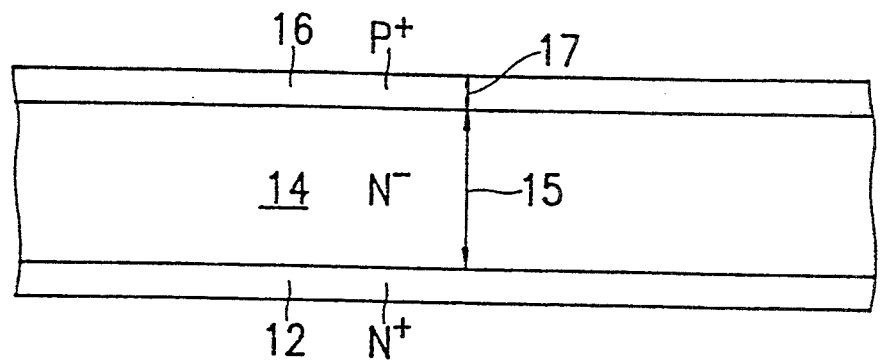
FIGS. 6-13 show in a schematic form cross-sectional views of a high-voltage power rectifier in different process stages of fabrication and in accordance with a preferred embodiment of the present invention.

With reference now to FIG. 6, the process for fabricating a semiconductor power device in accordance with a preferred embodiment of the present invention employs an N+ doped silicon substrate 12 as a starting point of the semiconductor power device. The silicon substrate 12 is preferably a 1,0,0 monosilicon substrate. An N− layer 14 is grown epitaxially on the substrate 12, having a thickness 15 in the range of preferably 20-100 μm. Another P+ region 16 is then grown epitaxially, or is doped on the N− layer 14, having a thickness 17 in the range of preferably 10 μm.

Figure 7:
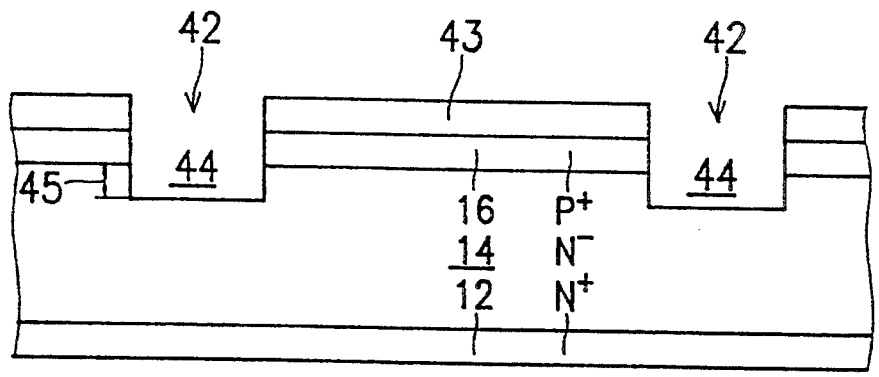

Referring next to FIG. 7. A mask 43 having openings 42 is formed on the surface of the device wafer, allowing the formation of grooves 44 by, for example, a reactive ion etching (RIE) procedure. Grooves 44 have a depth 45 such that each groove 44 cuts into the N− layer 14 for distance equal to about 5-20% of the thickness of the N− layer 14. This depth 45 is preferably 1-20 μm in this particular embodiment.

Figure 8:
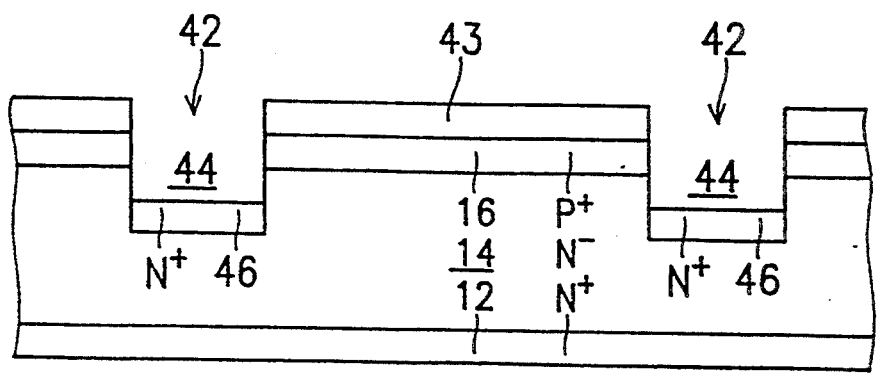

Referring next to FIG. 8, an optional ion implantation step is performed. N type ions, such as arsenic or phosphorous ions, are implanted through the openings 42 in the mask 43 and into the bottoms of the grooves 44. After the mask 43 is removed, the substrate is heated, preferably in a nitrogen environment, to drive the implanted ions further into the N+ doping region 46 at the bottom of the grooves 44.

Figure 9:
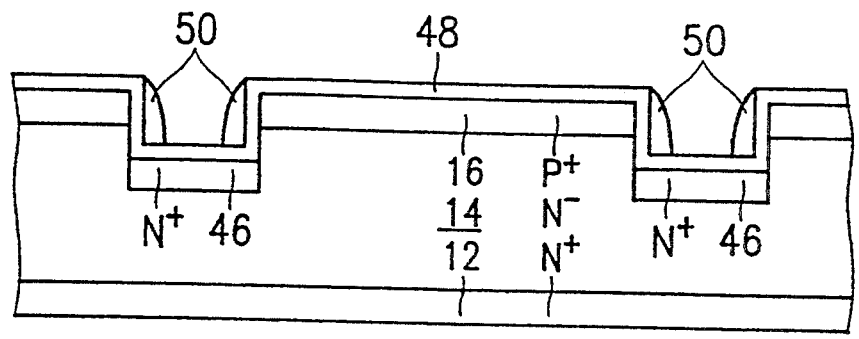

In FIG. 9, a layer of pad oxide 48 is formed on the wafer surface, preferably by heating the substrate 10 in an oxygen environment, the resulting pad oxide 48 having a thickness in the range of 0.05-0.2 μm. Low pressure chemical vapor deposition (LPCVD) is then preferably utilized to deposit a layer of silicon nitride, preferably having a thickness between 2 to 20 μm. After the formation of the silicon nitride layer, a reactive ion etching (RIE) procedure is performed to etch away the silicon nitride layer on top of the surface of the pad oxide layer 48. All of the silicon nitride layer is etched away except those portions which are attached to the sidewalls of the grooves 44 and which form silicon nitride spacers 50, as is shown in FIG. 9.

Figure 10:
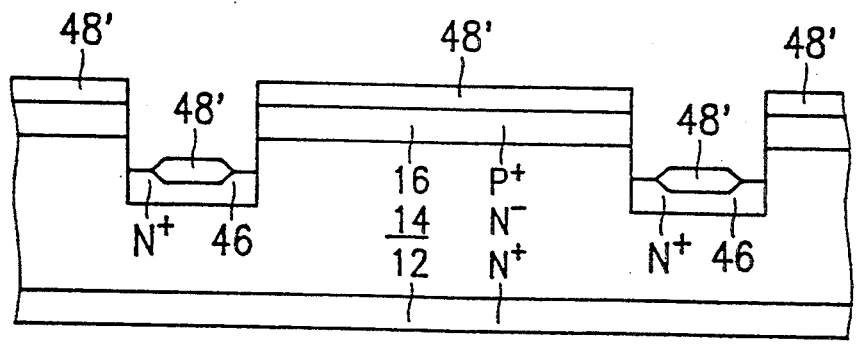

A thermal oxidation process is then performed to increase the thickness of the exposed portions 48' of the pad oxide layer 48 not covered by the silicon nitride spacers 50. The increase in thickness is in the range of 1-3 μm, as shown in FIG. 10. An etching process is then performed to etch away the silicon nitride spacer 50 in FIG. 9, exposing the pad oxide layer 48 attached to the sidewalls of the grooves 44. A conventional liquid etching procedure is then performed for a sufficient length of time to just remove the pad oxide layer 48 attached to the sidewalls as well as those portions at the bottoms of the grooves 44 that had not been grown thicker. This etch is terminated long before the thicker pad oxide 48' would have been etched away. Recall that the thicker pad oxide 48' is typically many times thicker than is the original pad oxide layer 48. Thus, the thicker pad oxide 48' is substantially unaffected by this etch, and the thicker pad oxide 48' remains on the upper surfaces of layer 16 and in the centers of grooves 44, as can be seen in FIG. 10.

Figure 11:
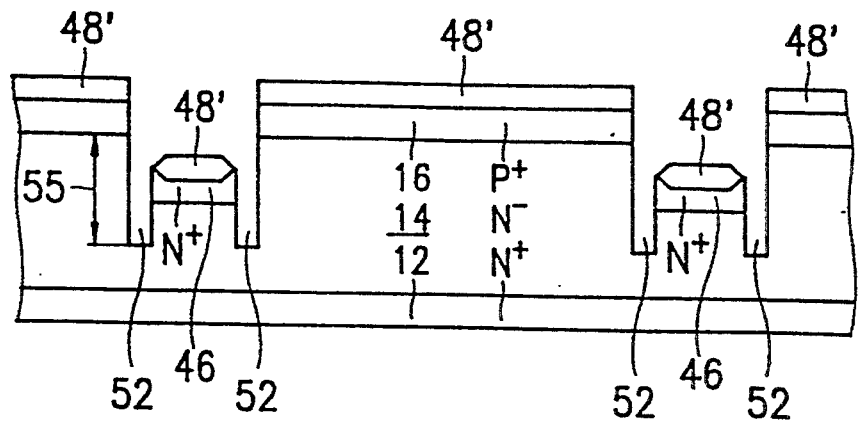

The thicker pad oxide layer 48' is then utilized as a mask for performing another etching procedure, such as an RIE procedure, to form a second set of grooves 52, which cut deep into the substrate 12, as is shown in FIG. 11, along each of the sidewalls of the original grooves 44. The depth 55 of the grooves 52 into the epitaxial N− layer 14 of the substrate 12 is in the range of 50 to 70% of the thickness 15 of the epitaxial N− layer 14. Notice that this depth 55 is measured between the surface of the N− layer 14 and the bottom of the grooves 52.

Figure 12:
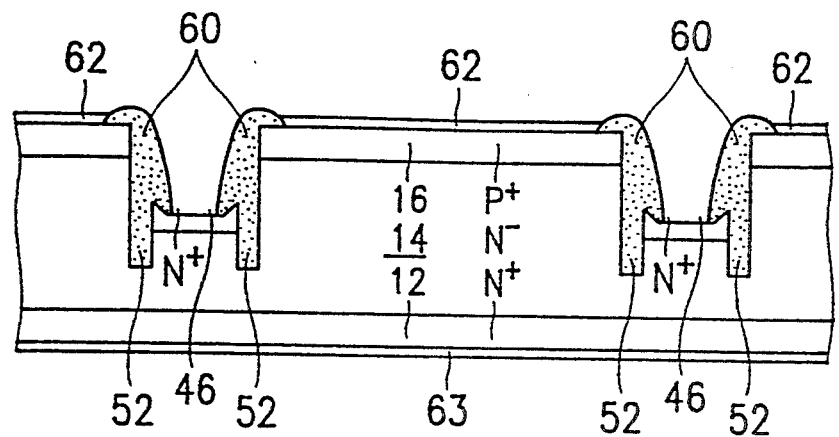
Figure 13:
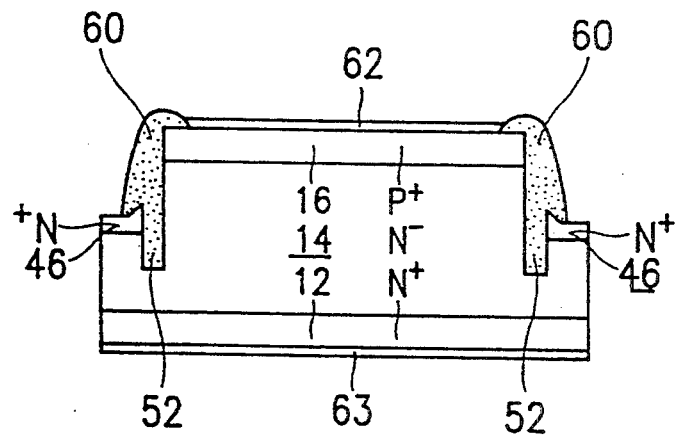

Referring now to FIG. 12, the pad oxide layer 48' is removed before a passivation layer 60 is deposited, preferably by chemical vapor deposition (CVD), into the grooves 52. The passivation layer 60, which protects the PN junction formed between N− region 14 and P+ region 16 that extends to the sidewalls of the grooves 52, is then patterned by conventional photolithography and etching processes to align to the precise position of the grooves 52. After the passivation layers 60 are formed, further masking procedures are employed to form metal layers 62 and 63 on both sides of the fabricated substrate 12, and the entire wafer containing a multiplicity of repeated semiconductor power devices is then separated to make individual device dies such as shown in FIG. 13.

Figure 14:
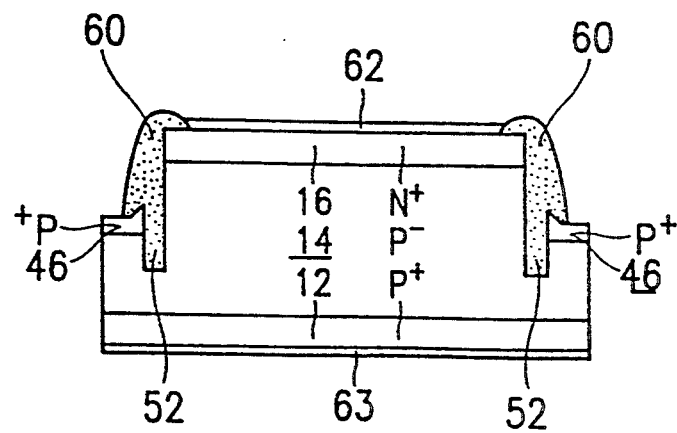
FIG. 14 illustrates in a cross-sectional view a high-voltage power rectifier in accordance with another preferred embodiment of the present invention.

For convenience of explanation, the above description illustrates the present invention in the context of a high voltage, high current diode using particular combinations of N and P regions. However, those skilled in the art will appreciate that the N and P regions may be interchanged. Therefore, a device having a structure identical to FIG. 13, but with reversed conductivity types, is depicted in FIG. 14. The device of FIG. 14 may be fabricated by using the fabrication process previously described with reference to FIGS. 6–13, but with exchanging the N and P conductivity types.

Summarizing the above-described process for fabricating semiconductor power device in accordance with the preferred embodiment of the present invention, only three photolithography procedures are required. They are, namely, masking to delineate the initial grooves, masking to delineate the protective layer, and masking to delineate the metal layers. At least one photolithography procedure is saved in comparison to the prior art process of fabricating a comparable power device.

In addition to reduced fabrication costs reflected in the saving in photolithography steps and the time required to perform those steps, the automatic alignment provided by the thick pad oxide layer also helps to prevent photolithography-related problems, which include precise alignment and focusing for optimum resolution. Furthermore, since the deep grooves 52 on each side of the shallower grooves 44 are self-aligned, the sidewall symmetry problems associated with prior art devices are reduced or overcome. Moreover, the mechanical strength of the entire substrate is also improved due to the fact that the deepened grooves reach a maximum of only about 70% of the thickness of the N⁻ layer 14, compared to the prior art technique in which the grooves completely penetrate layer 14. Also, since the etching steps do not need to penetrate so far into layer 14, the length of time to perform the associated etching step is shorter in the invention as disclosed. Thus, not only are there fewer etching steps, the etching steps which are performed tend to be of a shorter duration, thereby making the disclosed device less costly to manufacture.

Although the present invention of the process for fabrication of high-voltage semiconductor power device has been described based on the specific conditions in, for example, dimensions of the preferred embodiment, it is, however, apparent to persons skilled in the art that the present invention is not limited devices having at least one PN junction, such as rectifiers, thyristors, and transistors. Modifications to the exemplified material and process conditions, such as the reversal of the P and N layers in the device, can be made without departing from the scope of the disclosed invention which is defined in the following claims.

I claim:

1. A process for fabricating a high-voltage semiconductor device on a substrate of a first conductivity type, comprising the steps of:
   (a) forming a first layer of first conductivity type semiconductor material having a first thickness on said substrate and forming a second layer of second conductivity semiconductor material type having a second thickness on said first layer;
   (b) etching through said second layer into said first layer to form first grooves therein;
   (c) forming a pad oxide layer on exposed surfaces of said first and second layers;
   (d) forming protective spacers on sidewalls of said first grooves;
   (e) increasing the thickness of exposed portions of said pad oxide layer;
   (f) removing said protective spacers and portions of said pad oxide layer underlying said protective spacers;
   (g) etching through the bottom of said first grooves into said first layer, using remaining portions of said pad oxide as a mask, to form second grooves therein;
   (h) removing the remaining portions of said pad oxide layer; and
   (i) forming a passivation layer on sidewalls of said grooves and forming metal layers on said substrate and on said second layer.

2. The process for fabricating high-voltage semiconductor power device of claim 1, wherein said first layer is a lightly-doped epitaxial layer and said second layer is a doped layer formed thereon.

3. The process for fabricating high-voltage semiconductor power device of claim 1, wherein said protective spacers are formed of silicon nitride.

4. The process for fabricating high-voltage semiconductor power device of claim 1, between the steps (b) and (c) further comprising a step of forming a doped region of said first conductivity type covering at least the bottom of said first grooves.

5. The process for fabricating high-voltage semiconductor power device of claim 1, wherein said first conductivity type is P type and said second conductivity type is N type.

6. The process for fabricating high-voltage semiconductor power device of claim 1, wherein said first conductivity type is N type and said second conductivity type is P type.

7. The process for fabricating high-voltage semiconductor power device of claim 1, wherein said first thickness is in the range of 20 to 100 $\mu$m.

8. The process for fabricating high-voltage semiconductor power device of claim 1, wherein said second thickness is in the range of 1 to 10 $\mu$m.

9. The process for fabricating high-voltage semiconductor power device of claim 1, wherein said first grooves have a depth that is in the range of 5 to 20% of said first thickness.

10. The process for fabricating high-voltage semiconductor power device of claim 1, wherein said first grooves are formed by reactive ion etching.

11. The process for fabricating high-voltage semiconductor power device of claim 1, wherein said doped region of said first conductivity type is formed by implanting arsenic ions.

12. The process for fabricating high-voltage semiconductor power device of claim 1, wherein said doped region of said first conductivity type is formed by implanting phosphorous ions.

13. The process for fabricating high-voltage semiconductor power device of claim 1, wherein the thickness of said pad oxide layer is in the range of 0.05 to 0.2 $\mu$m.

14. The process for fabricating high-voltage semiconductor power device of claim 1, wherein said increase in thickness of said pad oxide layer is about 1 to 3 $\mu$m.

15. The process for fabricating high-voltage semiconductor power device of claim 1, wherein the depth of said second grooves is in the range of 50 to 70% of said first thickness.

* * * * *